United States Patent
Neeman et al.

(10) Patent No.: US 8,595,584 B2
(45) Date of Patent: Nov. 26, 2013

(54) METHOD AND APPARATUS FOR INTERLEAVING A DATA STREAM USING QUADRATURE PERMUTATION POLYNOMIAL FUNCTIONS (QPP)

(75) Inventors: Yuval Neeman, Ashquelon (IL); Guy Drory, Givataim (IL); Aviel Livay, Holon (IL); Inbar Schori, Givatayim (IL)

(73) Assignee: Freescale Semiconductor, Inc., Austin, TX (US)

( * ) Notice: Subject to any disclaimer, the term of this patent is extended or adjusted under 35 U.S.C. 154(b) by 265 days.

(21) Appl. No.: 12/990,865

(22) PCT Filed: May 19, 2008

(86) PCT No.: PCT/IB2008/051959
§ 371 (c)(1),
(2), (4) Date: Nov. 3, 2010

(87) PCT Pub. No.: WO2009/141682
PCT Pub. Date: Nov. 26, 2009

(65) Prior Publication Data
US 2011/0060963 A1  Mar. 10, 2011

(51) Int. Cl.
*H03M 13/00*  (2006.01)
(52) U.S. Cl.
USPC ............................ 714/755; 714/781; 714/730
(58) Field of Classification Search
USPC ................. 714/755, 781, 730, 718, 799, 722
See application file for complete search history.

(56) References Cited

U.S. PATENT DOCUMENTS

| | | | | | |
|---|---|---|---|---|---|
| 5,469,444 | A | * | 11/1995 | Endoh et al. | 714/722 |
| 5,561,671 | A | * | 10/1996 | Akiyama | 714/799 |
| 5,901,152 | A | * | 5/1999 | Tanaka et al. | 714/718 |
| 6,237,122 | B1 | * | 5/2001 | Maki | 714/730 |

OTHER PUBLICATIONS

Ryu J et al: "On Quadratic Inverses for Quadratic Permutation Polynomials Over Integer Rings" IEEE Transactions on Information Theory, IEEE, US, vol. 52, No. 3, Mar. 1, 2006, pp. 1254-1260.
Moision B and Hamkins J: "Coded Modulation for the Deep-Space Optical Channel: Serially Concatenated Pulse-Position Modulation" IPN Progress Report 42-161, vol. 42-161, May 15, 2005, pp. 1-25.
Nimbalker A et al: "ARP and QPP Interleavers for LTE Turbo Coding" Proc., IEEE Conference on Wireless Communications and Networking, WCNC 2008, Mar. 31, 2008, pp. 1032-1037.
Takeshita O: "A New Metric for Permutation Polynomial Interleavers" Information Theory, 2006 IEEE International Symposium on, IEEE, PI, Jul. 9-14, 2006, pp. 1983-1987.

(Continued)

*Primary Examiner* — Fritz Alphonse

(57) ABSTRACT

A semiconductor device comprising processing logic. The processing logic is arranged to configure interleaver logic to re-order data symbols of a data stream according to a quadrature permutation polynomial function. The processing logic is further arranged to: divide a cyclic group of values defined by the QPP function into a set of subgroups, the set of subgroups being capable of being defined by a set of linear functions; derive inverse functions for the set of linear functions defining the subgroups; and configure the interleaver logic to load the data symbols of the data stream into a buffer at locations within the buffer corresponding to a cyclic group of values representative of the inverse function for the QPP function based on the inverse functions of the set of linear functions defining the subgroups.

20 Claims, 7 Drawing Sheets

(56) References Cited

OTHER PUBLICATIONS

Cheng M K et al: "Optimizations of a Hardware Decoder for Deep-Space Optical Communications" IEEE Transactions on Circuits and Systems-I: Regular Papers, vol. 55, No. 2, Mar. 1, 2008, pp. 644-658.

Rosnes E et al: "Optimum Distance Quadratic Permutation Polynomial-Based Interleavers for Turbo Codes" Proc., IEEE International Symposium on Information Theory, ISIT 2006, Seattle, USA, Jul. 9-14, 2006, pp. 1988-1992.

International Search Report and Written Opinion correlating to PCT/IB2008/051959 dated Jan. 27, 2009.

* cited by examiner

US 8,595,584 B2

METHOD AND APPARATUS FOR INTERLEAVING A DATA STREAM USING QUADRATURE PERMUTATION POLYNOMIAL FUNCTIONS (QPP)

FIELD OF THE INVENTION

The field of this invention relates to a method and apparatus for interleaving a data stream, and more particularly to a method and apparatus for deriving a cyclic group of values representative of an inverse function for a quadrature permutation polynomial function for use during interleaving of a data stream.

BACKGROUND OF THE INVENTION

In the field of digital communications, turbo codes are a class of high performance error correction codes used to achieve maximal information transfer over a limited-bandwidth communication link, particularly in the presence of data-corrupting noise.

3GPP LTE (Long Term Evolution) is a name given to a project within the Third Generation Partnership Project (3GPP) to improve the UMTS (Universal Mobile Telecommunications System) mobile telephony standard, in order to cope with future requirements, such as improving efficiency, lowering costs, improving services, etc. Although the LTE is not a standard, per se, it is anticipated that a majority of modifications and extensions defined in the LTE, if not all of them, will be included within release 8 of the UMTS system. One such modification is the use of turbo codes for the channel coding scheme for transport blocks.

FIG. 1 illustrates an example of a turbo decoder 100, as is known in the art. The turbo decoder 100 is arranged to receive three sub-blocks of bits. The first sub-block of bits ($x_k$) comprises an m-bit block of payload data ($d_k$). The second sub-block comprises n/2 parity bits ($Y_{1k}$) for the payload data, computed using a first recursive systematic convolutional (RSC) coder. The third sub-block comprises n/2 parity bits ($Y_{2k}$) for a known permutation of the payload data, also computed using a second RSC coder. For the illustrated example, the second and third sub-blocks are received as a concatenated block. ($Y_k$), and separated into their separate sub-blocks ($Y_{1k}$) and ($Y_{2k}$) by demultiplexing mechanism 110. The decoder 100 comprises two elementary decoders 120, 130, serially interconnected with an interleaver 140 located between the two decoders 120, 130 for de-interleaving data bits within received data blocks.

As is known in the art, an interleaver, such as the interleaver 140 illustrated in FIG. 1, receives a stream of data comprising m bit blocks of data, re-orders the data bits within each block according to some scheme, criteria, function, etc, and outputs the re-ordered data bits. A conventional method for performing such a task comprises receiving the m-bit data block to be interleaved and storing all m bits of data in a first buffer. Once all m bits of data have been received, they can then be stored in a second buffer in the new order, and once all the data bits have been re-ordered in the second buffer, the interleaved data block can be outputted.

Such a conventional method of performing interleaving suffers from the problems of requiring two buffers to store the block of m data bits, and having to wait until all m bits of data have been received before the data block can be re-ordered. As a result, such a conventional method is inefficient in terms of the time taken to perform the interleaving, since it must wait until all m bits of data have been received and stored within the first buffer before commencing the re-ordering.

One known method for bypassing the need for a second buffer comprises writing the received data into a buffer in the order in which it is received, and then reading it from the buffer in the order in which the data is to be interleaved. However, this technique is not feasible when the operation of turbo decoding is performed by multiple processors, whereby received data block are divided into a plurality of segments, each segment being decoded by a different processor. In this case reading data from the first buffer (which has yet to be de-interleaved) requires multiple instances of the same interleaver, one for each segment or processor, where each interleaver instance reads data from a different position within the buffer. As will be appreciated by a skilled artisan, this is much more complicated than simply writing the received data to the first buffer, and then interleaving the data and writing it to a second buffer prior to decoding. Accordingly, such a solution significantly increases the cost and complexity of development.

As previously mentioned, one modification proposed in the 3GPP LTE is the use of turbo codes for the channel coding scheme for transport blocks. In particular, the 3GPP LTE proposes the use of the Quadratic Permutation Polynomial (QPP) function:

$$Pi(x) = (f_1 x + f_2 x^2) \% M$$

where M, $f_1$ and $f_2$ are parameters, sets of which are pre-defined within the 3GPP LTE.

In an article entitled 'On Quadratic Inverses for Quadratic Permutation Polynomials over Integer Rings' by Jonghoon Ryu and Oscar Y. Takeshita from the department of Electrical and Computer Engineering of The Ohio State University, submitted as a Correspondence to the IEEE Transactions on Information Theory on Apr. 1, 2005 (and revised Nov. 15, 2005) (http://arxiv.org/pdf/cs.IT/0511060), it is proposed to use quadratic inverse functions for some of the parameter sets for the QPP function defined in the 3GPP LTE.

As will be appreciated, the use of an inverse function enables a location of a data bit within the re-ordered/interleaved data block to be determined as the data bit is received. Accordingly, the data bit may be stored directly into its interleaved location within an interleaved buffer. For example, in a case where a block of data bits ($b_0$, $b_1$, $b_2$, $b_3$, $b_4$) is to be interleaved according to an interleaving function f defining the new order of the data bits as being (2, 3, 4, 0, 1), the data bits are reordered to ($b_2$, $b_3$, $b_4$, $b_0$, $b_1$). The inversed interleaving function $f^{-1}$ defines the relative position of the data bits within the reordered block for each bit (3, 4, 0, 1, 2). Thus, $b_0$ may be stored directly into position '3' of the buffer, $b_1$ may be stored directly into position '4' of the buffer, $b_2$ may be stored directly into position '0' of the buffer, etc.

In this manner, it is not necessary to wait until all data bits within an interleaving block have been received before the interleaving can be performed, since the interleaving is performed 'on the fly'.

However, a problem with the use of quadratic inversions is that such inversions are not readily available for all of the parameter sets for the QPP function defined in the 3GPP LTE. Accordingly, this does not provide a practical solution for interleavers that are required to perform interleaving of a data stream for each of the parameter sets for the QPP function defined in the 3GPP LTE.

SUMMARY OF THE INVENTION

The present invention provides a semiconductor device, a method for interleaving a data stream and a computer-readable storage element as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE EMBODIMENTS OF THE INVENTION

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The examples of embodiments of the invention will now be described with reference to a method and device for interleaving a data stream, for example as may be utilised within a turbo encoder. However, as will be appreciated by a skilled artisan, the invention may equally be applied to a method and apparatus for de-interleaving a data stream, such as may be utilised within a turbo decoder. Accordingly, references hereinafter to 'interleaving' are to be understood as encompassing interleaving and de-interleaving equally.

Figure 1:
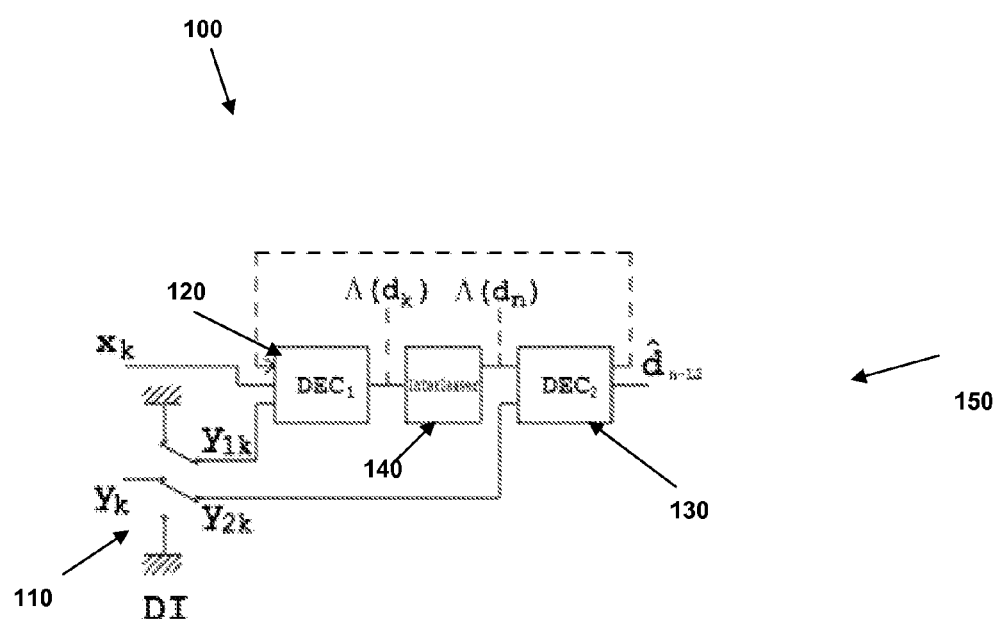
FIG. 1 illustrates an example of a known turbo encoder.
Figure 2:
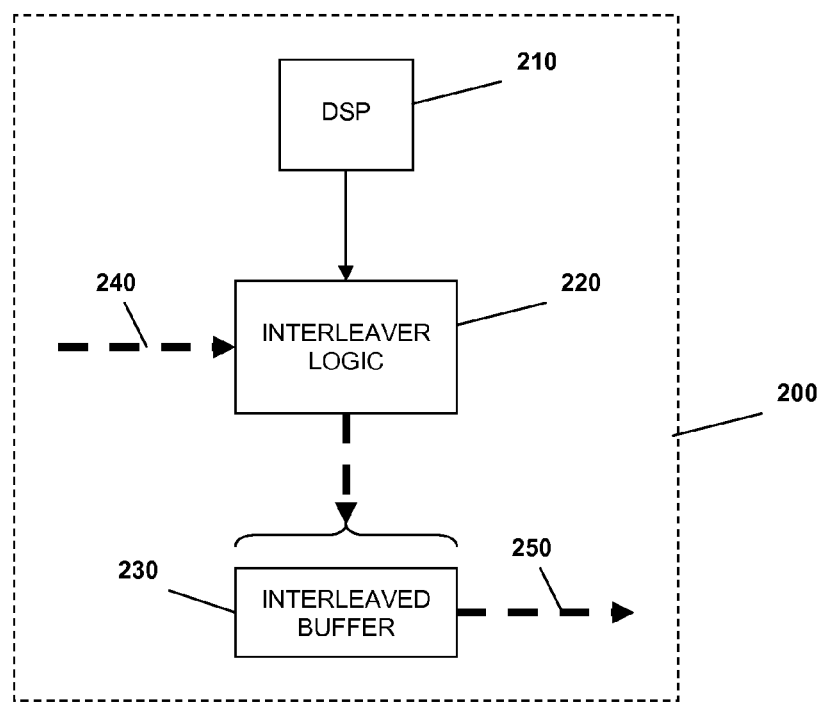
FIG. 2 illustrates an example of a semiconductor device adapted according to the present invention.

FIG. 2 illustrates an example of a semiconductor device 200 adapted in accordance with some embodiments of the present invention. The semiconductor device 200 comprises processing logic 210 arranged to configure interleaver logic 220, for example comprising recursive interleaving logic, to re-order data symbols of a data stream 240 according to a quadrature permutation polynomial (QPP) function. In particular, the signal processing logic 210 is arranged to divide a cyclic group of values defined by the QPP function into a set of subgroups, the set of subgroups being capable of being defined by a set of linear functions. The signal processing logic 210 is further arranged to derive inverse functions for the set of linear functions defining the subgroups, and derive a cyclic group of values representative of an inverse function for the QPP function from the inverse functions of the set of linear functions defining the subgroups. The signal processing logic 210 is still further arranged to configure the interleaver logic 220 to load the data symbols of the data stream 240 into a buffer 230 at locations within the buffer corresponding to the cyclic group of values representative of the inverse function for the QPP function.

In this manner, a cyclic group of values 250 representative of the inverse function for the QPP can be derived and used to enable 'on the fly' interleaving, thereby enabling an efficient, low interleaving process. In particular, by enabling 'on the fly' interleaving, received data bits may be stored directly into a buffer at locations within the buffer corresponding to reordering of the data stream following interleaving. Thus, interleaving of a stream of data bits may be initiated without the need to wait for a complete data block to be received. Consequently latency of interleaving data streams may be significantly reduced.

For the illustrated example, the processing logic 210 is in a form of a digital signal processor, such as a microcontroller, arranged to execute computer-readable code thereon. However, the processing logic 210 may be in a form of any other manner of programmable processing logic, such as a programmable system-on-chip, or non-programmable logic, such as a non-programmable gate array.

Furthermore, for the illustrated example, the interleaver logic and buffer 230 form an integral part of the semiconductor device 200. However, it is contemplated that in alternative embodiments the interleaver logic 220, or buffer 230, may be discrete from the semiconductor device 200.

Figure 3:
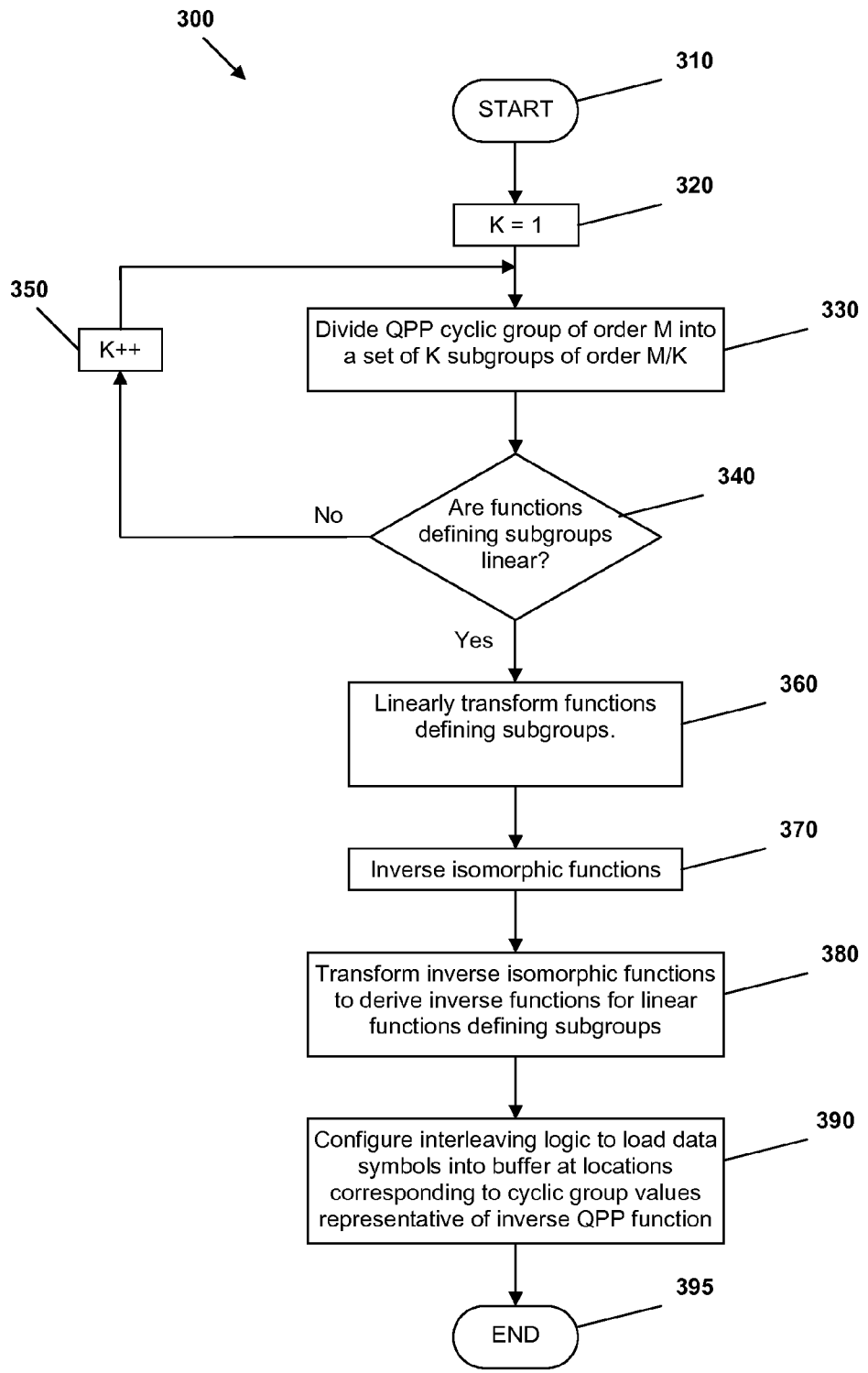
FIG. 3 illustrates a simplified flowchart of an example of a method for interleaving a data stream.

Referring now to FIG. 3, there is illustrated a simplified flowchart 300 of an example of a method for interleaving a data stream according to a quadrature permutation polynomial (QPP) function in accordance with some embodiments of the invention, for example as may be implemented by the processing logic 210 of FIG. 2.

The method starts at step 310, and moves to step 320 where a value K is initialised by being set to a logical '1' value. Next, in step 330, a cyclic group of values of order M defined by the QPP function is divided into a set of K subgroups, of order M/K. The method then moves to step 340, where it is determined whether the set of K subgroups are capable of being defined by a set of linear functions. If the functions defining the K subgroups are not linear, the method moves to step 350, where the value K is incremented by a logical '1' value, and the method loops back to step 330, and the cyclic group of values defined by the QPP function is again divided. In this manner, the lowest value for K may be identified, simplifying the process described below.

If the functions defining the K subgroups are linear, in step 340, the method moves on to step 360, where for the illustrated example, the linear functions defining the K subgroups are linearly transformed such that values defined by the transformed functions comprise values from 0 to ((M/K)−1), as described in greater detail below.

Next, in step 370, inverse functions for the transformed functions are derived. The inverse transformed functions are then themselves linearly transformed to derive inverse linear functions for the original set of linear functions defining the K subgroups, in step 380. As will be appreciated, and as demonstrated below with reference to FIG. 4, values defined by the inverse linear functions collectively form a cyclic group of values representative of the inverse function for the QPP function. Thus, in step 390, the method comprises configuring interleaving logic to load data symbols of the data stream into a buffer at locations within the buffer corresponding to the cyclic group of values representative of the inverse function for the QPP function. The method then ends at step 395.

Figure 4:
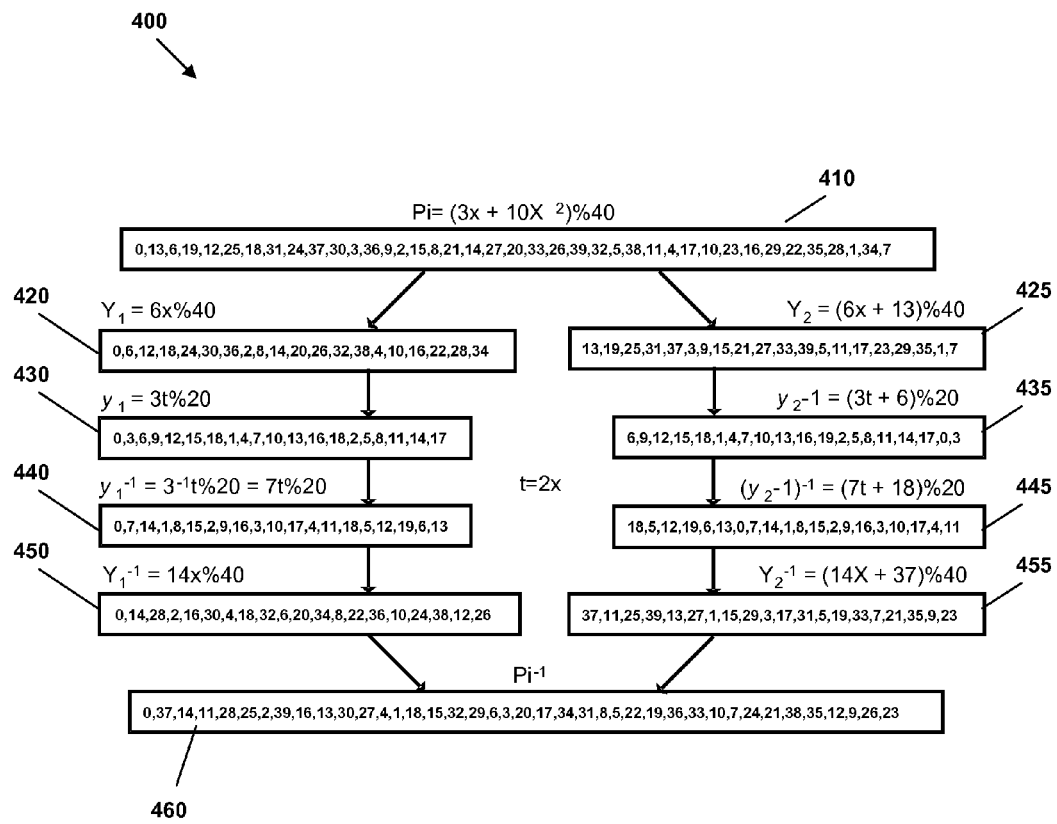
FIG. 4 illustrates an example of deriving a cyclic group of values representative of the inverse function for a QPP function.

Referring now to FIG. 4, there is illustrated an example of deriving a cyclic group of values representative of the inverse function for a QPP function in more detail, according to some embodiments of the invention. As previously mentioned, the 3GPP LTE (3$^{rd}$ Generation Partnership Project Long Term Evolution) proposes the use of turbo codes for the channel coding scheme for transport blocks. In particular, for the purpose of interleaving data symbols within the turbo encoder, the 3GPP LTE proposes the use of the QPP function:

$$Pi(x)=(f_1 x+f_2 x^2)\% M \qquad \text{[Equation 1]}$$

where M, $f_1$ and $f_2$ are parameters, sets of which are predefined within the 3GPP LTE. Thus, in the case of the 3GPP LTE proposal, the QPP function defines a cyclic group of order M.

For the example illustrated in FIG. 4, the QPP function Pi(x) is given the following parameters: $f_1=3$; $f_2=10$; and M=40. Accordingly, the QPP function may be expressed by:

$$Pi(x)=(3x+10x^2)\% 40 \qquad \text{[Equation 2]}$$

The cyclic group of values, having order M, defined by the QPP function is illustrated in box 410. As previously mentioned, the cyclic group of values 410 defined by the QPP function is divided into a set of subgroups, the set of subgroups being capable of being defined by a set of linear functions.

For the case where the QPP function is in a form of Equation 1 above, Pi(x) may be calculated by the following two cascaded recursions:

$$R_1: R_1[0]=0, R_1[x]=(R_1[x-1]+f_1+f_2 R_2[x-1])\% M \qquad \text{[Equation 3]}$$

$$R_2: R_2[0]=0, R_2[x]=(R_2[x-1]+2f_2)\% M \qquad \text{[Equation 4]}$$

Dividing the cyclic group of values 410 defined by the QPP function into a set of K subgroups is equivalent to dividing Equations 3 and 4 above into K sets of two cascaded recursions (denoted by $Ri_1$ and $Ri_2$ where i=0 to K−1) as illustrated below:

$$Ri_1: Ri_1[0]=(f_1 i+f_2 i^2)\% M, Ri_1[x]=(Ri_1[x-1]+Kf_1+K^2 f_2+Ri_2[x-1])\% M \qquad \text{[Equation 5]}$$

$$Ri_2: Ri_2[0]=(2Kf_2 i), Ri_2[x]=(Ri_2[x-1]+2K^2 f_2)\% M \qquad \text{[Equation 6]}$$

The division gives linear subgroups when Equation 6 is constant, namely when $((2K^2 f_2)\% M=0)$. Thus, each linear subgroup may be calculated by a single recursion as illustrated in equation 7, where $f_1$, $f_2$ and M comprise parameters of the QPP function, K is a divisor factor, i is an index of a recursive element comprising the range i=0 to K−1, and R is the recursive element:

$$Ri: Ri[0]=(f_1 i+f_2 i^2)\% M, Ri[x]=(Ri[x-1]+Kf_1+K^2 f_2+2Kf_2 i)\% M \qquad \text{[Equation 7]}$$

Referring back to FIG. 4, the QPP function Pi(x) has been given the following parameters: $f_1=3$; $f_2=10$; and M=40. In order for the condition $((2K^2 f_2)\% M=0)$ to be met, and therefore for the subgroups to be linear, it can be seen that $(20K^2)\% 40=0$, and therefore K=2. Since the subgroups 420, 425 are linear, they can be represented Y=ax+b. Thus, the cyclic group of values 410 defined by the QPP function may be divided into a set of two subgroups 420, 425, respectively defined by:

$$Y_1=(6x)\% 40 \qquad \text{[Equation 8]}$$

$$Y_2=(6x+13)\% 40 \qquad \text{[Equation 9]}$$

$Y_1$ and $Y_2$ are subgroups of the cyclic group of values defined by the QPP function Pi(x) 410, with $Y_1$ representing the even elements and $Y_2$ representing the odd elements. An inverse of $Y_1$ represents the index of $Y_1$ elements within the QPP function Pi(x) 410. Thus, the first element of the inverse of $Y_1$ represents the index of the first element in the QPP function Pi(x) 410, the second element of the inverse of $Y_1$ represents the index of the second element in the QPP function Pi(x) 410, and so on. In order to see the relationship between $Y_1$ and its inverse, we need to transform the functions into a domain where inverse functions represent the index of an element in the current series of values. Thus, for $Y_1$ we need to remove all odd elements from the domain by letting t=2x. For $Y_2$ we need to remove all even elements from the domain by substracting 1 and letting t=2x. In addition, since there are only twenty elements in each subgroup, and since t=2x, the new functions are over a %20 domain. Thus, the subgroups 420, 425 are linearly transformed into the functions below, Equations 10 and 11, such that values 430, 435 defined by Equations 10 and 11 comprise values from 0 to ((M/K)−1), which for the example illustrated in FIG. 4 equates to values from 0 to 19.

$$y_1=(3t)\% 20 \qquad \text{[Equation 10]}$$

$$(y_2-1)=(3t+6)\% 20 \qquad \text{[Equation 11]}$$

After transforming $Y_1$ and $Y_2$ (Equations 8 and 9) to $y_1$ and $y_2$ (Equations 10 and 11) using algebraic operations, the inverse functions for $y_1$ and $y_2$ may be calculated. The inverse of:

$$y_1=(3t)\% 20$$

may be written as:

$$y_1^{-1}=(\tfrac{1}{3}t)\% 20$$

Multiplying both sides by 21, remembering that 21%20=1, the inverse of $y_1$ can be represented by Equation 12 below, which defines values 440 as illustrated in FIG. 4. Similarly, the inverse of:

$$(y_2-1)=(3t+6)\% 20$$

may be written as $$(y_2-1)^{-1}=((y-1)/3-2)\% 20$$

Again, multiplying both sides by 21, and taking into account (−2)% 20=18%20, the inverse of $(y_2-1)$ can be represented by Equation 13 below, which defines values 445 as illustrated in FIG. 4.

$$y_1-1=(7t)\% 20 \qquad \text{[Equation 12]}$$

$$(y_2-1)^{-1}=(7t+18)\% 20 \qquad \text{[Equation 13]}$$

These inverse functions (Equations 12 and 13 above) are then linearly transformed (by letting t=2× and returning to the 40% domain) to derive inverse linear functions for the set of linear functions (Equations 8 and 9 above) defining the two subgroups giving the inverse linear functions:

$$Y_1^{-1}=(14x)\% 20 \qquad \text{[Equation 14]}$$

$$Y_2^{-1}=(3x+37)\% 20 \qquad \text{[Equation 15]}$$

As can be seen, these inverse linear functions define subgroups of values 450, 455 which may be merged together to form a cyclic group of values 460, representative of the inverse function for the QPP function Pi(x). As will be appreciated, and as previously mentioned, this cyclic group of values, representative of the inverse function for the QPP function represents the relative positioning of each data symbol following re-ordering. Accordingly, these values may be used to directly load the data symbols of the data stream into a buffer at locations within the buffer corresponding to the cyclic group values representative of the inverse function for the QPP function, and thereby at locations corresponding to the required re-ordering thereof.

Thus, inverse QPP function cyclic values can be calculated for all QPP functions proposed within the 3GPP LTE. Furthermore, the cyclic group of values defined by any of these 3GPP LTE QPP functions may be divided into K linear subgroups, where K is less than or equal to 28. Thus, embodiments of the invention enable efficient, 'on the fly' interleaving for all 3GPP LTE defined QPP functions.

Figure 5:
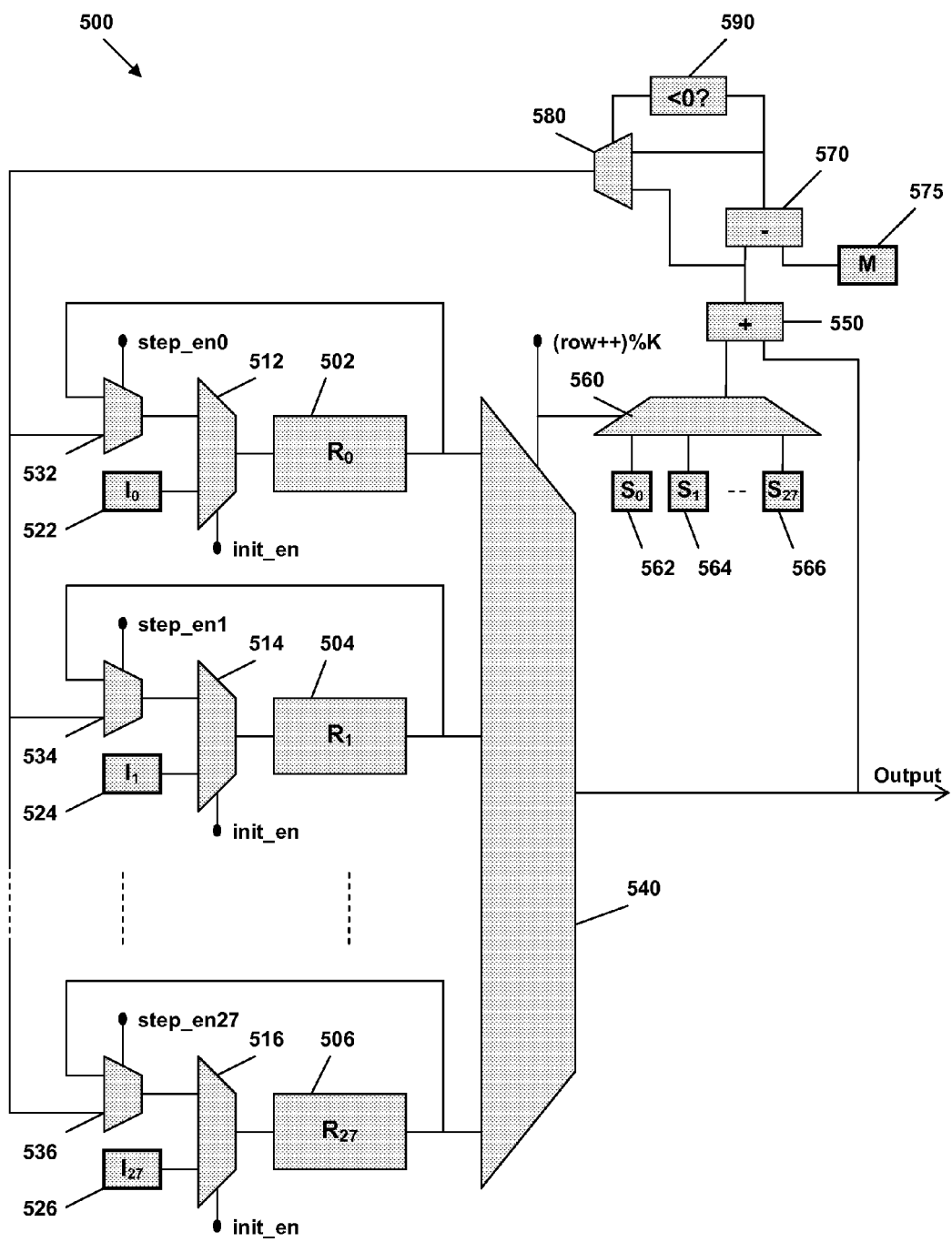
FIG. 5 illustrates an example of recursion logic.

Referring now to FIG. 5, there is illustrated an example of recursion logic 500, such as may form a part of interleaver logic 220 of FIG. 2, for interleaving a data stream according to some embodiments of the present invention. The recursion logic 500 comprises a plurality of recursion elements 502, 504, 506. As previously mentioned, for each defined parameter set for the QPP function defined by the 3GPP LTE, the cyclic group of values defined by the QPP function can be divided into less than or equal to twenty eight linear subgroups. In use, the interleaver logic 220 uses one recursion element 502, 504, 506 per linear subgroup. Thus, for the example illustrated in FIG. 5, the recursion logic 500 comprises twenty eight recursion elements, R0 to R27. As will be appreciated by a skilled artisan, if the number of linear subgroups is too large, the number of recursion elements that the interleaver logic requires would become too large to be practical.

However, since for each defined parameter set for the QPP function defined by the 3GPP LTE, the cyclic group of values defined by the QPP function can be divided into less than or equal to twenty eight linear subgroups LTE, the interleaver logic 220 requires no more than twenty eight recursion elements in order to be able to perform the interleaving for all of the defined parameter sets therefor.

Each recursion element 502, 504, 506 is arranged to load and output a value provided thereto. Accordingly, an input of each recursion element 502, 504, 506 is operably coupled to an output of a multiplexer 512, 514, 516. Each of these first set of multiplexers 512, 514, 516 comprises two inputs. A first of these inputs is operably coupled to a programmable element 522, 524, 526 for storing an initial value for the respective recursion element 502, 504, 506. Each of the first set of multiplexers 512, 514, 516 is controlled by way of an init_en control signal. In this manner, upon initialisation of the recursion logic 500, or upon resetting of the recursion logic 500, the init_en control signal may be used to cause the first set of multiplexers 512, 514, 516 to load the initial values stored within the programmable elements 522, 524, 526 into the respective recursion element 502, 504, 506. A second input of each of the first set of multiplexers 512, 514, 516 is operably coupled to an output of a further multiplexer 532, 534, 536.

An output of each recursion element 502, 504, 506 is operably coupled to an input of an output multiplexer 540. The output multiplexer 540 is controlled by a row counter signal (row++)% K, as described in more detail below. The output of the output multiplexer 540 provides an output signal comprising address values to, for example, an interleaved address generator or the like (not shown), with which a received data stream my be loaded into a memory buffer or the like (not shown) according to values output by output multiplexer 540. The output of the output multiplexer 540 is further operably coupled to an input of addition logic 550. A further input of addition logic 550 is operably coupled to an output of step multiplexer 560. Inputs of step multiplexer 560 are operably coupled to programmable elements 562, 564, 566 for storing step values $S_i$ for respective recursion elements 502, 504, 506. The step multiplexer 560 is also controlled by the row counter signal (row++)% K.

The output of addition logic 550 is operably coupled to an input of modulo multiplexer 580, and outputs the sum of the output of output multiplexer 540 and the output of step multiplexer 560.

The output of addition logic 550 is further operably coupled to an input of subtraction logic 570. A further input of subtraction logic 570 is operably coupled to programmable element 575 for storing a modulo value M. The output of subtraction logic 570 is operably coupled to a further input of modulo multiplexer 580, and outputs the result of subtracting the modulo value M from the value outputted by addition logic 550. The output of the subtraction logic 570 is further operably coupled to logic 590, which determines whether the output value of the subtraction logic 570 is less than zero, and if so outputs an appropriate signal, which is used to control modulo multiplexer 580. In particular, if the value output by the subtraction logic 570 is less than zero, the logic 590 causes the multiplexer to output the value received from addition logic 550. Conversely, if the value output by the subtraction logic is greater than or equal to zero, the logic 590 causes the multiplexer to output the value received from the subtraction logic 570.

The output of the modulo multiplexer 580 is operably coupled to inputs of each of multiplexers 532, 534, 536. A further input of each of the multiplexers 532, 534, 536 is operably coupled to the output of the respective recursion element 502, 504, 506, with each of the multiplexers 532, 534, 536 being controlled by a respective step_eni signal.

As previously mentioned, the 3GPP LTE proposes the use of the QPP function:

$$Pi(x)=(f_1 x+f_2 x^2)\% M$$

where M, $f_1$ and $f_2$ are parameters, sets of which are predefined within the 3GPP LTE. In accordance with embodiments of the present invention, the cyclic group of values defined by the QPP function may be divided into a set of subgroups capable of being defined by a set of linear functions calculated using Equation 7 above. Inverse functions for these linear functions may then be derived that each define a subgroup of values, which may be merged together to form a cyclic group of values representative of the inverse function for the QPP function Pi(x). In particular, each cyclic subgroup of values defined by an inverse linear function may be represented by an initial value, a step value, which when added to a value within the subgroup derives the next value in the subgroup, and a modulo value.

For example, referring back to FIG. 4, the QPP function Pi(x) has been given the following parameters: $f_1=3$; $f_2=10$; and M=40. As shown above, for these parameters, it is possible to divide the cyclic group of values 410 defined by the QPP function into two subgroups 420, 425, defined by Equations 14 and 15 above respectively. The first subgroup of values 420 can be defined by an initial value of '0', a step value of '14' and a modulo value of '40'. The second subgroup of values 425 can be defined by an initial value of '37', a step value of '14' and a modulo value of '40'.

Referring back to FIG. 5, the recursion logic 500 may be configured to generate the cyclic group of values representative of the inverse function for the QPP function Pi(x) by programming the initial values, step values and modulo value into programmable elements 522, 524, 526, 562, 564, 566, 575 respectively. Thus, for the example illustrated in FIG. 4, initial values of '0' and '37' for the two subgroups are programmed into programmable elements 522 and 524; step values of '14' are programmed into programmable elements 562, 564, and a modulo value of '40' is programmed into programmable element 575.

Thus, upon initialisation of the recursion logic 500, or upon resetting of the recursion logic 500, the init_en control signal is enabled, causing the first set of multiplexers 512, 514, 516 to load the initial values stored within the programmable elements 522, 524, 526 into the respective recursion element 502, 504, 506. Consequently, the first recursion element 502 loads the value of '0' from programmable element 522, and the second recursion element 504 loads the value of '37' from programmable element 524. The respective step_eni signal for each of the multiplexers 532, 534, 536 causes the multiplexers 532, 534, 536 to loop the outputs of their respective recursion elements 502, 504, 506 back into the inputs of the first set of multiplexers 512, 514, 516. The init_en control signal is then disabled, causing the first set of multiplexers 512, 514, 516 to load the values received from multiplexers 532, 534, 536 into their respective recursion elements 502, 504, 506.

The row counter signal (row++)% K causes output multiplexer 540 to output the value of '0' provided by the first recursion element 502, which as illustrated in FIG. 4 is the first value in the group of values representative of the inverse function for the QPP function. The row counter signal (row++)% K also causes step multiplexer 560 to output the step value of '14' stored in programmable element 562. The addition logic 550 adds the step value to the value output by the output multiplexer 540, and outputs the resulting value of '14'. The summation logic subtracts the modulo value of '40' stored in programmable element 575 from the value of '14' output by the addition logic 550, and outputs the resulting value of '−26'. Logic 590 determines that the output value of the subtraction logic 570 is less than zero, and causes modulo multiplexer 580 to output the value of '14' received from the addition logic 550.

The control signal step_en0 for multiplexer 532 is then enabled, causing multiplexer 532 to output the value of '14' received from modulo multiplexer 580, which as a result is loaded into the first recursion element 502. In this manner, the first recursion element 502 is loaded with the next value in the respective subgroup. The control signal step_en0 is then disabled, causing multiplexer 532 to loop the output of recursion element 502 back into the input of multiplexer 512.

The row counter signal (row++)% K is then incremented, causing the output multiplexer 540 to output the value of '37' provided by the second recursion element 504, which as illustrated in FIG. 4 is the second value in the group of values representative of the inverse function for the QPP function. The row counter signal (row++)% K also causes step multiplexer 560 to output the step value of '14' stored in programmable element 564. The addition logic 550 adds the step value to the value output by the output multiplexer 540, and outputs the resulting value of '51'. The summation logic subtracts the modulo value of '40' stored in programmable element 575 from the value of '14' output by the addition logic 550, and outputs the resulting value of '11'. Logic 590 determines that the output value of the subtraction logic 570 is greater than zero, and causes modulo multiplexer 580 to output the value of '11' received from the subtraction logic 570.

The control signal step_en1 for multiplexer 534 is then enabled, causing multiplexer 534 to output the value of '11' received from modulo multiplexer 580, which as a result is loaded into the second recursion element 504. In this manner, the second recursion element 504 is loaded with the next value in the respective subgroup. The control signal step_en1 is then disabled, causing multiplexer 534 to loop the output of recursion element 504 back into the input of multiplexer 514.

The row counter signal (row++)% K is then once again incremented, but for the example illustrated in FIG. 4, since there are only two subgroups, the row counter (row++)% K is reset to zero, causing the output multiplexer 540 to output the value provided by the first recursion element 502, which now comprises the value of '14'. This process continues until all values within each subgroup have been outputted.

Figure 6:
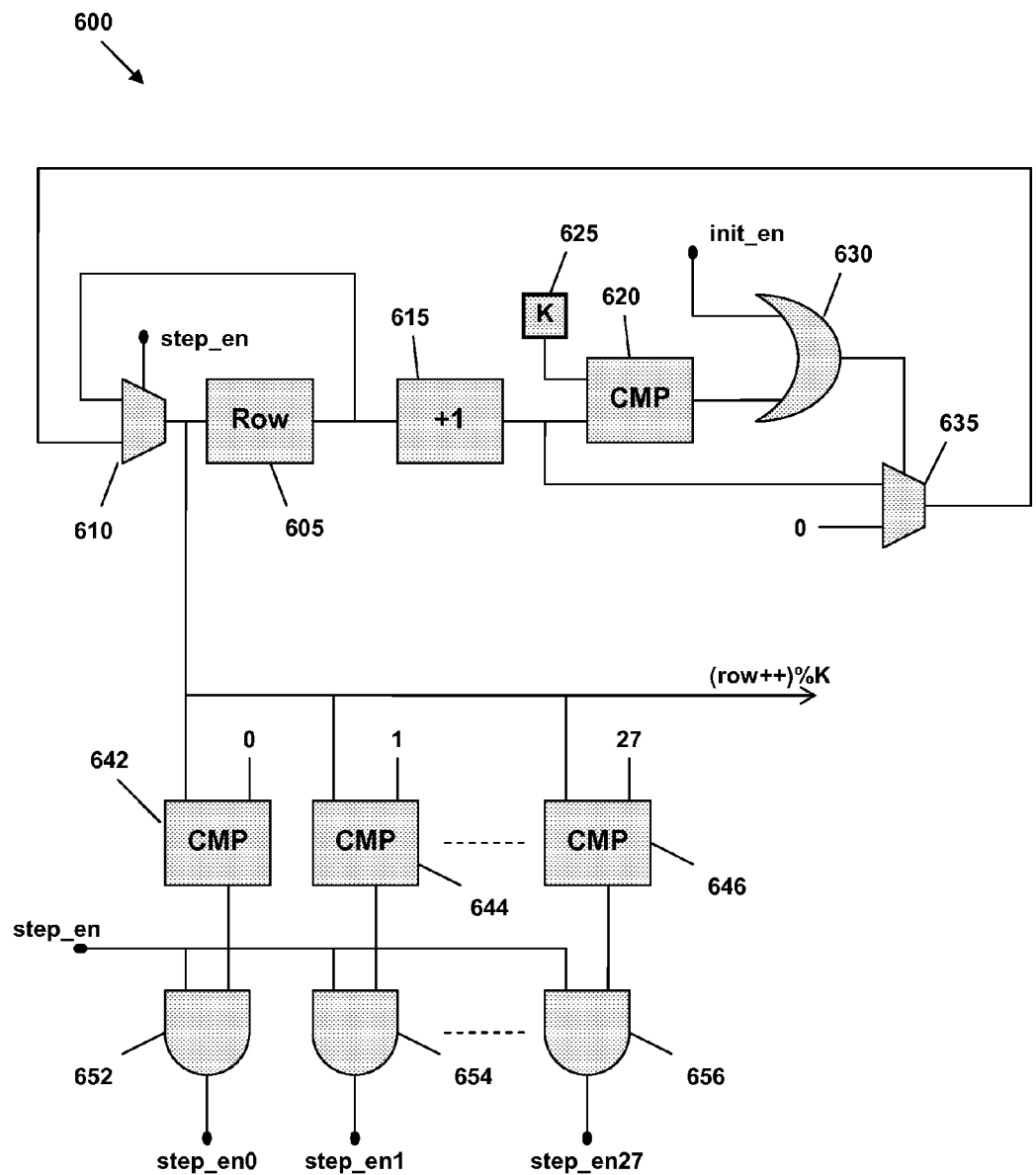
FIG. 6 illustrates an example of control logic.

Referring now to FIG. 6, there is illustrated an example of a control logic 600 arranged to provide control signals to that part of recursion logic 500 illustrated in FIG. 5. The control logic 600 comprises a row counter register 605 arranged to load and output a row value provided thereto. Accordingly, an input of the counter register is operably coupled to an output of a multiplexer 610.

The output of the row counter register 605 is operably coupled to an input of incrementing logic 615, arranged to increment a value received from the row counter register 605, and output the incremented value. The output of the incrementing logic 615 is operably coupled to a comparator 620, which compares the incremented value from the incrementing logic 615 with a value stored in programmable element 625, and if the incremented value equals that stored in programmable element 625, the comparator 620 outputs an appropriate signal, such as a '1' value. The output of the comparator 620 is operably coupled to an OR gate 630, a further input of which is operably coupled to an initialisation control signal init_en. The output of the OR gate 630 is operably coupled to a control line of a multiplexer 635. As a result, either of the initialisation control signal init_en or the comparator 620 can cause the OR gate 630 to output a '1' value, and thereby influence the control signal for multiplexer 635.

A first input of the multiplexer 635 is operably coupled to the output of the incrementing logic 615, whilst a second input of the multiplexer 635 is operably coupled to a '0' value source. The multiplexer 635 is caused to output the '0' value from its second input when the multiplexer 635 receives a '1' value on its control line. Otherwise, the multiplexer 635 outputs the value received from the incrementing logic 615. In this manner, the initialisation control signal init_en and the comparator 620 are each able to cause the multiplexer 635 to output a '0' value.

The output of the multiplexer 635 is operably coupled to an input of the multiplexer 610, whilst a further input of the multiplexer 610 is operably coupled to the output of the row counter register 605. The multiplexer 610 is controlled by a step_en signal.

Upon initialisation of the control logic 600, the initialisation control signal init_en is enabled (e.g. set to a logical '1' value), causing the multiplexer 635 to output a logical '0' value. Substantially concurrently, the step_en signal is enabled, causing the multiplexer 610 to output the value '0' received from multiplexer 635, causing the row counter register 605 to load and output the value '0'. The step_en signal is then disabled, causing the multiplexer 610 to loop the output of the row counter register 605 back into the input of the row counter register 605.

The incrementing logic 615 increments the '0' value output by the row counter register 605, and outputs a logical '1' value. The comparator 620 compares this value to the value stored in programmable element 625, and whilst the two values are not equal, the comparator 620 outputs a logical '0' value to the OR gate 630. Whilst the initialisation control signal init_en remains enabled (e.g. a logical '1' value), the multiplexer outputs the '0' value, irrespective of the output of the incrementing logic 615.

Upon disabling of the initialisation control signal init_en, the multiplexer 635 outputs the value received from the incrementing logic 615, which comprises a '1'. Upon the step_en signal subsequently being enabled, the multiplexer 610 outputs the '1' value received from multiplexer 635, causing the row counter register to load and output the '1' value. The step_en signal is then disabled again, causing the multiplexer 610 to loop the output of the row counter register 605 back into the input of the row counter register 605. The incrementing logic 615 then increments the '1' value, and outputs a logical '2' value, which the comparator 620 compares to the value stored in programmable element 625.

In this manner, the value loaded and output by row counter register 605 is continuously incremented once, each cycle of the step_en signal, until the value output by incrementing logic 615 equals the value stored in programmable element 625. When the value output by incrementing logic 615 equals the value stored in programmable element 625, the comparator 620 causes multiplexer 635 to output the logical '0' value, resetting the row counter register value to '0'.

In accordance with some embodiments of the present invention, the programmable element 625 is configured to store a value representing the number of subgroups K into which the cyclic group of values defined by the QPP function is divided. Thus, for the example illustrated in FIG. 4, the programmable element 625 is configured to store a value of '2'. Accordingly, the value loaded and output by row counter register 605 cycle through values '0' and '1'.

For the example illustrated in FIG. 6, the output of multiplexer 610 is used to provide the row counter signal (row++)% K, as used to control output multiplexer 540 and step multiplexer 560 of FIG. 5. The output of multiplexer 610 is further operably coupled to comparators 642, 644, 646. Each of comparators 642, 644, 646 compares the output of multiplexer 610 to a value, the values ranging incrementally from '0' up to '27' for the illustrated example, and when the values match, outputs a '1' value. The output of each comparator 642, 644, 646 is operably coupled to an input of a respective AND gate 652, 654, 656. A second input of each of the AND gates 652, 654, 656 is operably coupled to the step_en signal. In this manner, the comparator 642, 644, 646 associated with the value output by the multiplexer 610, causes its respective AND gate 652, 654, 656 to output a '1' value when the step_en signal is enabled. The output of each AND gate 652, 654, 656 is used to provide respective a step_eni signal, as used to control multiplexers 532, 534, 536 of FIG. 5. In this manner, control logic 600 generates cyclic control signals, based on the step_en signal and row counter signal (row++)% K, to multiplexers 532, 534, 536.

Table 1 below illustrates an example of the operation of the recursion logic 500 and control logic 600 implementing the example of FIG. 4.

TABLE 1

| Clk_cycle | 0 | 1 | 2 | 3 | 4 | 5 | 6 | 7 | 8 | 9 | 10 |
|---|---|---|---|---|---|---|---|---|---|---|---|
| Init_en | 0 | 1 | 0 | 0 | 0 | 0 | 0 | 0 | 0 | 0 | 0 |
| Step_en | 0 | 0 | 0 | 0 | 1 | 1 | 1 | 1 | 1 | 1 | 1 |
| R0 | — | — | 0 | 0 | 0 | 14 | 14 | 28 | 28 | 2 | 2 |
| R1 | — | — | 37 | 37 | 37 | 37 | 11 | 11 | 25 | 25 | 39 |
| (row++)% K | — | — | 0 | 0 | 0 | 1 | 0 | 1 | 0 | 1 | 0 |
| output | — | — | 0 | 0 | 0 | 37 | 14 | 11 | 28 | 25 | 2 |

For the initial clock cycle, clk_cycle 0, the init_en and step_en signals are disabled (e.g. set to a logical '0' value). In the following clock cycle, clk_cycle 1, init_en is enabled, thereby initialising the recursion logic 500 and control logic 600. The init_en signal is then disabled in the following clock cycle. The step_en remains disabled for that clock cycle, and the next, maintaining the interleaving logic 500 and control logic in an initialised state. In the fifth clock cycle, clk_cycle 4, step_en is enabled, commencing the row counter signal and the cyclic control signals step_eni as described above. In this manner, the recursion logic 500 may be configured to output the cyclic group of values representative of the inverse function for the QPP function.

As will be appreciated, the recursion logic 500 illustrated in FIG. 5 and control logic 600 illustrated in FIG. 6 may form integral parts of an interleaving logical component, for example the interleaver logic 220 of FIG. 2, and may be implemented by way of a single programmable state-machine. Alternatively, the recursion logic 500 and control logic 600 may be implemented by discrete components.

Figure 7:
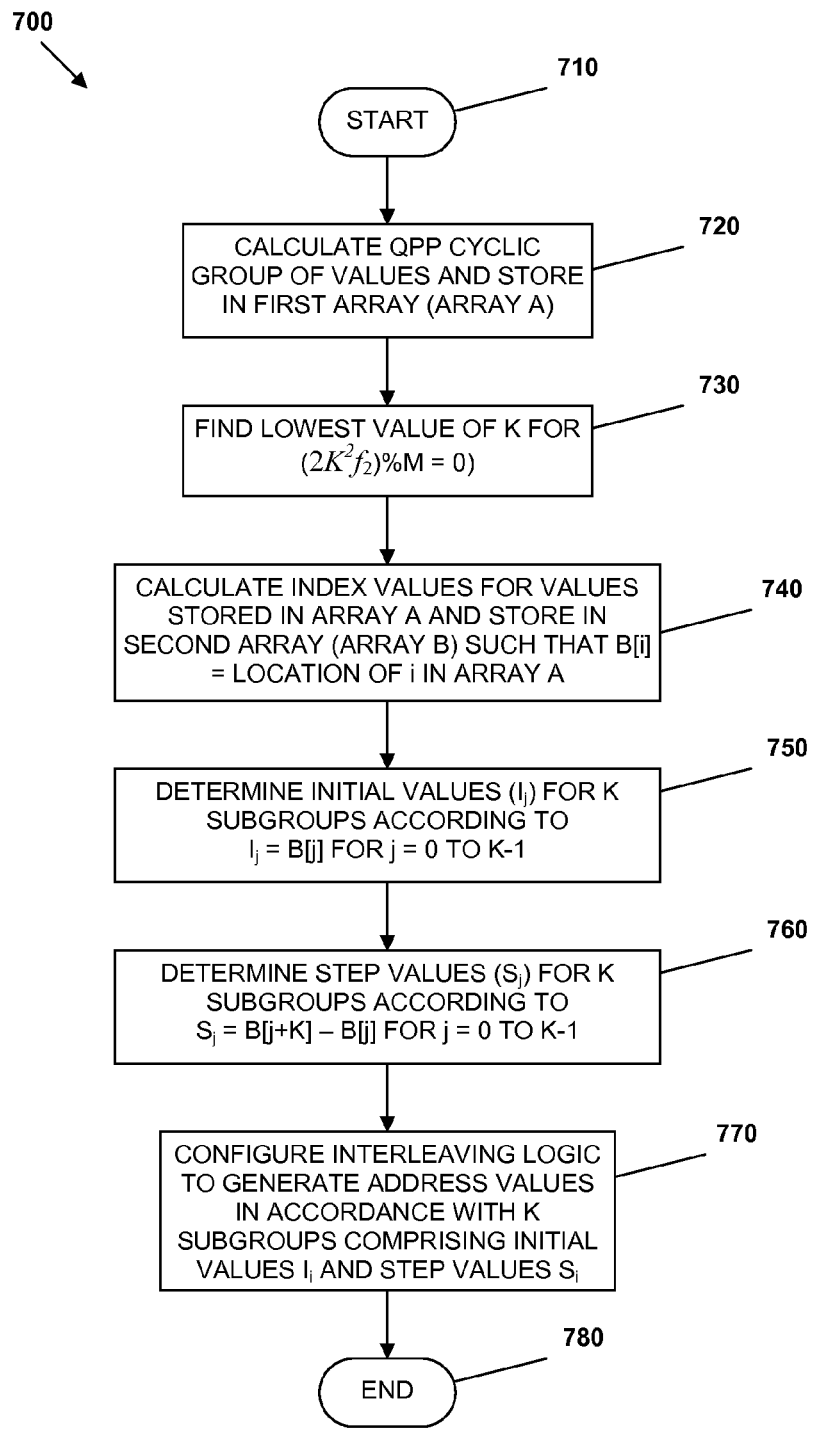
FIG. 7 illustrates a simplified flowchart of an example of a method for interleaving a data stream according to a quadrature permutation polynomial function.

Referring now to FIG. 7, there is illustrated a simplified flowchart 700 of a method for interleaving a data stream according to a quadrature permutation polynomial (QPP) function in accordance with some alternative embodiments of the invention, for example as may alternatively be implemented by processing logic 210 of FIG. 2.

The method starts at step 710, and moves to step 720 where the QPP cyclic group of values, such as values 410 of FIG. 4, are calculated and stored in a first array (array A). Next, in step 730, lowest value of K is found such that $(2K^2 f_2):\% M=0)$. The method then moves to step 740, where index values for the values stored in array A, such as values 460 of FIG. 4, are calculated and stored in a second array (array B) such that B[i]=location of i in array A. In accordance with some embodiments of the invention, only the first 2K−1 index values may be calculated, since only these are required for calculating initial and step values, as described in more detail below.

Initial values $I_j$ for K subgroups are then determined, in step 750, where $I_j$=B[i] for j=0 to K−1. Next, in step 760, step values $S_j$ for the K subgroups are determined, where $S_j$=B[j+K]B[j] for j=0 to K−1. The method then moves on to step 770, with the configuration of interleaving logic, such as the interleaving logic 500 illustrated in FIG. 5, to generate address values in accordance with K subgroups comprising initial values $I_j$ and step values $S_j$, for example as described with reference to FIGS. 5 and 6. The method then ends at step 780.

In this manner, by finding the lowest value of K for which $(2K^2 f_2):\% M=0)$, the cyclic group of values defined by the QPP function can be divided into a set of K subgroups capable of being defined by a set of linear functions. In addition, the initial values $I_j$ and step values $S_j$ for each subgroup represent the inverse functions for the set of linear functions defining the subgroups. Thus, the interleaving logic is able to load data symbols of a received data stream into a buffer at locations within the buffer corresponding to the cyclic group of values representative of the inverse function for the QPP function based on the initial values $I_j$ and step values $S_j$.

It is envisaged that embodiments of the invention may be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a hard disk, a CD-ROM, an optical storage device, a magnetic storage device, a ROM (Read Only Memory), a PROM (Programmable Read Only Memory), a EPROM (Erasable Programmable Read Only Memory), a EEPROM (Electrically Erasable Programmable Read Only Memory) and a Flash memory, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, connections may be any type of connection suitable to transfer signals from or to the respective nodes, units or devices, for example via intermediate devices. Accordingly, unless implied or stated otherwise the connections may for example be direct connections or indirect connections.

Some of the above embodiments, as applicable, may be implemented using a variety of different information processing systems. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermedial components. Likewise, any two components so associated can also be viewed as being 'operably connected,' or 'operably coupled,' to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device comprising processing logic, the processing logic being arranged to configure interleaver logic to re-order data symbols of a data stream according to a quadrature permutation polynomial (QPP) function;
   wherein the processing logic is arranged to divide a cyclic group of values defined by the QPP function into a set of subgroups, the set of subgroups being capable of being defined by a set of linear functions;
   wherein the processor logic is arranged to derive inverse functions for the set of linear functions defining the subgroups and configure the interleaver logic to load the data symbols of the data stream into a buffer at locations within the buffer corresponding to a cyclic group of values representative of the inverse function for the QPP function based on the inverse functions of the set of linear functions defining the subgroups.

2. The semiconductor device of claim 1 wherein the interleaver logic comprises recursive interleaving logic.

3. The semiconductor device of claim 2 wherein the QPP function defines a cyclic group of values of order M, and the processing logic is arranged to divide the cyclic group of values defined by the QPP function into a set of K subgroups of order M/K.

4. The semiconductor device of claim 2 wherein the processing logic is arranged to derive inverse functions for the set of linear functions defining the subgroups by linearly transforming said linear functions defining the subgroups such that values defined by the transformed functions comprise values from 0 to ((M/K)−1), deriving inverse functions for the transformed functions, and linearly transforming said inverse functions to derive inverse functions for the set of linear functions defining the subgroups.

5. The semiconductor device of claim 1 wherein the QPP function defines a cyclic group of values of order M, and the processing logic f2-i-Gf is arranged to divide the cyclic group of values defined by the QPP function into a set of K subgroups of order M/K.

6. The semiconductor device of claim 5 wherein the each cyclic subgroup of values defined by an inverse linear function is represented by an initial value, a step value, which when added to a value within the subgroup derives the next value in the subgroup, and a modulo value.

7. The semiconductor device of claim 5 wherein the interleaver logic is arranged to perform interleaving operations within a turbo encoder.

8. The semiconductor device of claim 1 wherein the processing logic is arranged to derive inverse functions for the set of linear functions defining the subgroups by linearly transforming said linear functions defining the subgroups such that values defined by the transformed functions comprise values from 0 to ((M/K)−1), deriving inverse functions for the transformed functions; and linearly transforming said inverse functions to derive inverse functions for the set of linear functions defining the subgroups.

9. The semiconductor device of claim 1 wherein the QPP function is given by Pi(x)=(f1x+f2x2)% M, where M, f1 and f2 are parameters, sets of which are predefined.

10. The semiconductor device of claim 9 wherein the processing logic f2-i-Gf is arranged to derive the subgroups, into which the cyclic group of values defined by the OPP function is divided, by calculating recursions of:

$$Ri:Ri[O]=(f1i+f2i2)\% \; M; Ri[x]=(Ri[x-1]+Kf1+K2f2+2Kif2)\% \; M$$

where: f1, f2 and M comprise parameters of the OPP function, K is a divisor factor, i is an index of a recursive element comprising the range i=0 to K1, and R is the recursive element.

11. The semiconductor device of any preceding claim 1 wherein the each cyclic subgroup of values defined by an inverse linear function is represented by an initial value, a step value, which when added to a value within the subgroup derives the next value in the subgroup, and a modulo value.

12. The semiconductor device of claim 11 wherein the processing logic is arranged to configure the interleaver logic to load the data symbols of the data stream into a buffer at locations within the buffer corresponding to the cyclic group of values representative of the inverse function for the QPP function by programming a plurality of initial values, step values and a modulo value into programmable elements of the interleaver logic.

13. The semiconductor device of any preceding claim 1 wherein the interleaver logic and forms an integral part of the semiconductor device.

14. The semiconductor device of claim 1 wherein the semiconductor device is adapted to be operably coupled to the interleaver logic discrete from the semiconductor device.

15. The semiconductor device of any preceding claim 1 wherein the interleaver logic is arranged to perform interleaving operations within a turbo encoder.

16. The semiconductor device of claim 15 wherein the interleaver logic is arranged to perform interleaving operations within a transceiver for a mobile communication device.

17. The semiconductor device of claim 1 wherein the interleaver logic is arranged to perform interleaving operations within a turbo decoder.

18. A method for interleaving a data stream according to a quadrature permutation polynomial (QPP) function, wherein the method comprises:
dividing, by processing logic of a semiconductor device, a cyclic group of values defined by the QPP function into a set of subgroups, the set of subgroups being capable of being defined by a set of linear functions;
deriving, by the processing logic, inverse functions for the set of linear functions defining the subgroups; and
loading data symbols of the data stream into a buffer at locations within the buffer corresponding to a cyclic group of values representative of the inverse function for the QPP function based on the inverse functions of the set of linear functions defining the subgroups.

19. A non-transitory computer-readable storage element having computer-readable code stored thereon for programming signal processing logic to perform-interleaving a data stream according to a quadrature permutation polynomial (QPP) function, wherein the signal processing logic when programmed with the code perform the method comprising the code
dividing a cyclic group of values defined by the QPP function into a set of subgroups, the set of subgroups being capable of being defined by a set of linear functions;
deriving inverse functions for the set of linear functions defining the subgroups; and
loading data symbols of the data stream into a buffer at locations within the buffer corresponding to a cyclic group of values representative of the inverse function for the QPP function based on the inverse functions of the set of linear functions defining the subgroups.

20. The computer-readable storage element of claim 19, wherein the computer readable storage medium comprises at least one of a hard disk, a CD-ROM, an optical storage device, a magnetic storage device, a ROM (Read Only Memory), a PROM (Programmable Read Only Memory), a EPROM (Erasable Programmable Read Only Memory), a EEPROM (Electrically Erasable Programmable Read Only Memory) and a Flash memory.

* * * * *